US012598760B2

(12) United States Patent
Park et al.

(10) Patent No.: US 12,598,760 B2
(45) Date of Patent: Apr. 7, 2026

(54) SEMICONDUCTOR DEVICE AND METHOD OF FABRICATING THE SAME

(71) Applicant: Samsung Electronics Co., Ltd., Suwon-si (KR)

(72) Inventors: Jungmin Park, Suwon-si (KR); Hanjin Lim, Suwon-si (KR); Hyungsuk Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 472 days.

(21) Appl. No.: 18/108,629

(22) Filed: Feb. 12, 2023

(65) Prior Publication Data

US 2024/0030278 A1     Jan. 25, 2024

(30) Foreign Application Priority Data

Jul. 25, 2022     (KR) ........................ 10-2022-0091827

(51) Int. Cl.
H10D 1/00         (2025.01)
H10D 1/68         (2025.01)

(52) U.S. Cl.
CPC ............. H10D 1/042 (2025.01); H10D 1/694 (2025.01); H10D 1/716 (2025.01)

(58) Field of Classification Search
CPC ........ H10D 1/042; H10D 1/694; H10D 1/716; H10D 1/68; H10D 1/692; H10D 1/696; H10B 12/033; H10B 12/30; H10B 12/03; H10B 12/482; H10B 12/488
See application file for complete search history.

(56) References Cited

U.S. PATENT DOCUMENTS

| | | | |
|---|---|---|---|
| 7,320,911 B2 | 1/2008 | Basceri et al. | |
| 7,939,447 B2 | 5/2011 | Bauer et al. | |
| 8,318,578 B2 | 11/2012 | Shea et al. | |
| 9,042,161 B2 | 5/2015 | Koyama et al. | |
| 10,276,650 B2 | 4/2019 | Wu et al. | |
| 10,923,478 B2 | 2/2021 | Gambee et al. | |
| 2016/0104763 A1* | 4/2016 | Choi ...................... | H10D 1/716 |
| | | | 257/532 |
| 2016/0343716 A1 | 11/2016 | Seo | |
| 2018/0166449 A1* | 6/2018 | Pak ........................ | H10D 1/043 |
| 2018/0240800 A1* | 8/2018 | Ahn ...................... | H10D 1/716 |
| 2020/0083319 A1 | 3/2020 | Yi et al. | |
| 2021/0272961 A1* | 9/2021 | Tung ..................... | H10B 12/34 |
| 2021/0384194 A1 | 12/2021 | Woo et al. | |

(Continued)

FOREIGN PATENT DOCUMENTS

| | | |
|---|---|---|
| KR | 10-2024-0015370 A | 2/2024 |
| TW | 201824273 A | 7/2018 |

*Primary Examiner* — Omar F Mojaddedi
(74) *Attorney, Agent, or Firm* — Muir Patent Law, PLLC

(57)         ABSTRACT

A semiconductor device comprising a substrate, lower electrodes vertically extended on the substrate and horizontally spaced apart from each other, a conductive pattern provided on the substrate to conformally cover the lower electrodes, supporting patterns provided to penetrate the conductive pattern and connected to portions of side surfaces of the lower electrodes, and conductive islands disposed on surfaces of the supporting patterns. The conductive islands may be distributed on the surfaces of the supporting patterns to be spaced apart from each other, and the conductive pattern may be spaced apart from and electrically disconnected from the conductive islands.

14 Claims, 16 Drawing Sheets

(56)     References Cited

U.S. PATENT DOCUMENTS

2022/0059540 A1*   2/2022   Zhao ...................... H10D 1/042
2022/0108986 A1     4/2022   Kim et al.
2022/0254785 A1*   8/2022   Lai ....................... H10B 12/488

* cited by examiner 210  220    311   230  240   222           220

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2022-0091827, filed on Jul. 25, 2022, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a capacitor and a method of fabricating the same.

Due to their small-sized, multifunctional, and/or low-cost characteristics, semiconductor devices are being esteemed as important elements in the electronic industry. With the advancement of the electronic industry, there is an increasing demand for a semiconductor device with higher integration density. To increase the integration density of the semiconductor device, it is necessary to reduce linewidths of patterns constituting the semiconductor device. However, novel and expensive exposure technologies are needed to reduce the linewidths of the patterns, and thus, it becomes difficult to increase the integration density of the semiconductor device. Accordingly, a variety of studies on new technology for increasing integration density of a semiconductor device are being actively conducted.

SUMMARY

An embodiment of the inventive concept provides a semiconductor device with a reduced size and a method of fabricating the same.

According to an embodiment of the inventive concept, a semiconductor device may comprise a substrate, lower electrodes vertically extended on the substrate and horizontally spaced apart from each other, a conductive pattern provided on the substrate and conformally covering the lower electrodes, supporting patterns penetrating the conductive pattern and connected to portions of side surfaces of the lower electrodes, and conductive islands disposed on surfaces of the supporting patterns. The conductive islands may be distributed on the surfaces of the supporting patterns to be spaced apart from each other, and the conductive pattern may be spaced apart from and electrically disconnected from the conductive islands.

According to an embodiment of the inventive concept, a method of fabricating a semiconductor device may comprise forming an insulating layer on a substrate, forming lower electrode contacts on the substrate to penetrate the insulating layer, alternatingly stacking sacrificial layers and supporting layers on the insulating layer to form a stack, forming lower electrodes to penetrate the stack and to be in contact with the lower electrode contacts, patterning the supporting layers to form supporting patterns, removing the sacrificial layers to expose the lower electrodes, performing a deposition process, in which a metal material is used, on the lower electrodes and the supporting patterns to form a conductive pattern on the lower electrodes, forming a dielectric layer to cover the supporting patterns and the conductive pattern, and forming an upper electrode to cover the dielectric layer. The conductive pattern may be formed to cover top surfaces and side surfaces of the lower electrodes, which are exposed by the supporting patterns, and to expose the supporting patterns. In the deposition process, a first deposition rate of the metal material deposited on the lower electrodes may be faster than a second deposition rate of the metal material deposited on the supporting patterns.

According to an embodiment of the inventive concept, a method of fabricating a semiconductor device may comprise stacking a sacrificial layer and a supporting layer on a substrate, forming lower electrodes to penetrate the supporting layer and the sacrificial layer and to be in contact with the substrate, patterning the supporting layer to form a supporting pattern, removing the sacrificial layer to expose side surfaces of the lower electrodes, which are not in contact with the supporting patterns, and performing a deposition process, in which a metal material is used, on the lower electrodes and the supporting pattern to form a conductive pattern on top surfaces of the lower electrodes and on the side surfaces of the lower electrodes, which are not in contact with the supporting patterns. The conductive pattern may be formed to expose a surface of the supporting pattern. The deposition process may include repeating a cycle, and the number of the cycles, which are repeated to deposit a single atomic layer of the metal material on the lower electrode, may be less than the number of the cycles, which are repeated to deposit a single atomic layer of the metal material on the supporting pattern.

BRIEF DESCRIPTION OF THE DRAWINGS

FIGS. 4 to 13 are diagrams illustrating a method of fabricating a semiconductor device according to an example embodiment of the inventive concept.

DETAILED DESCRIPTION

Example embodiments of the inventive concepts will now be described more fully with reference to the accompanying drawings, in which example embodiments are shown. Like numerals refer to like elements throughout.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. It will be understood that when an element is referred to as "contacting" or being "in contact with" another element (or using any form of the word "contact"), there are no intervening elements present at the point of contact.

Figure 1:
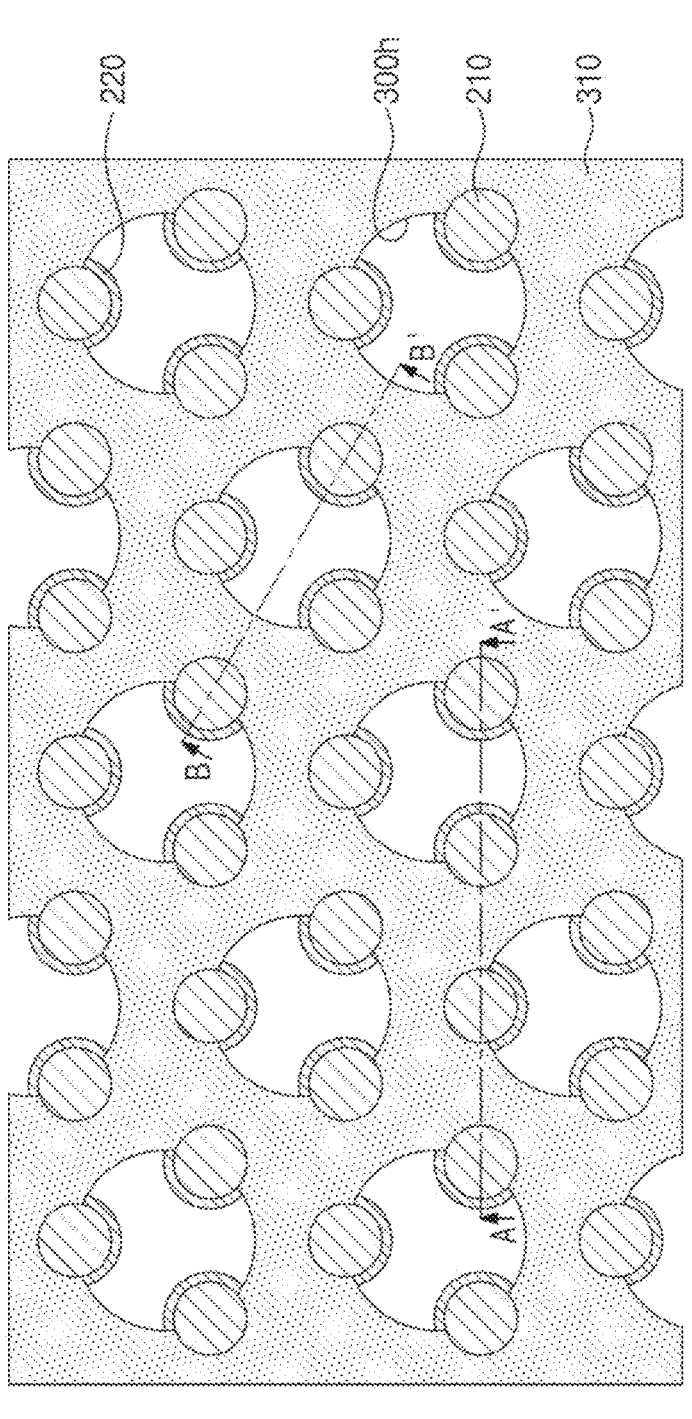
FIG. 1 is a plan view illustrating a semiconductor device according to an example embodiment of the inventive concept.
Figure 2:
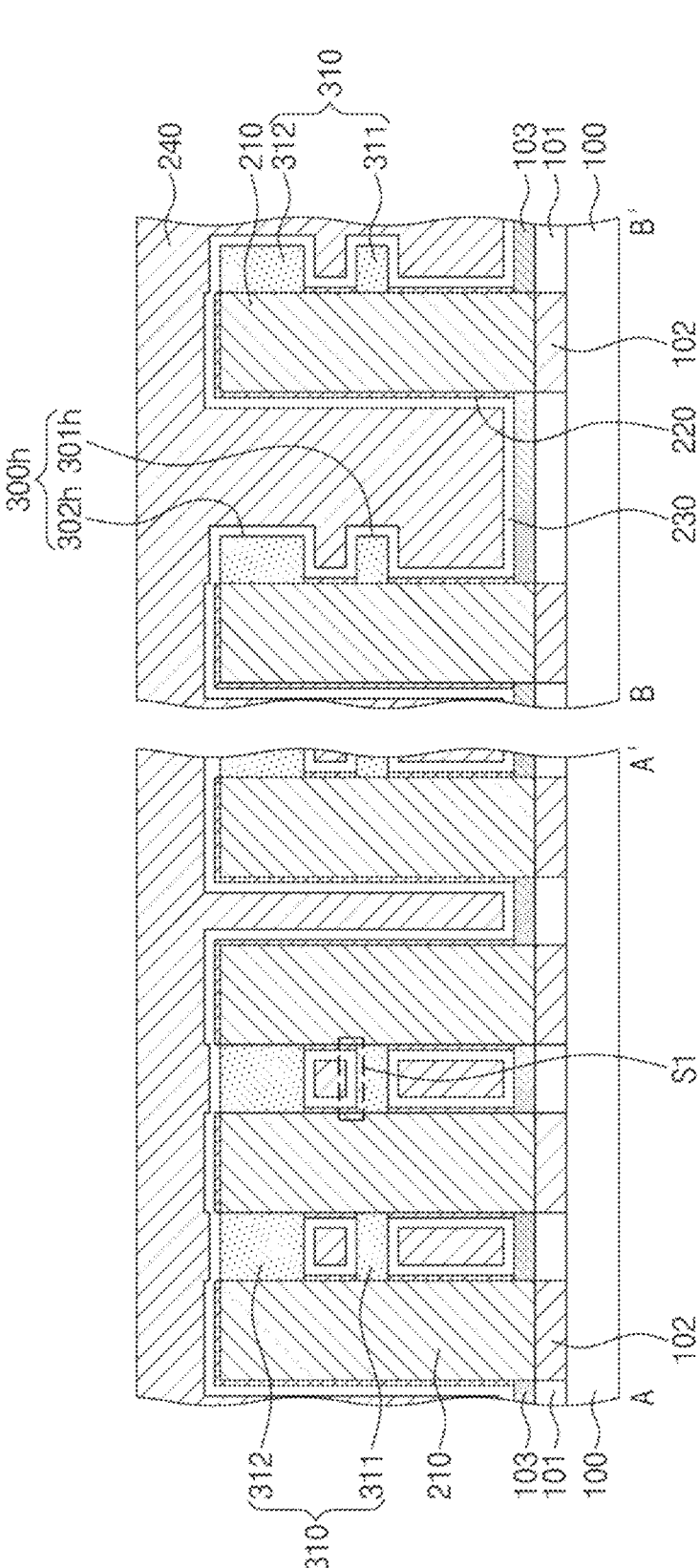
FIG. 2 is a sectional view illustrating cross-sections of a semiconductor device, which are taken along lines A-A' and B-B' of FIG. 1, according to an example embodiment of the inventive concept.
Figure 3:
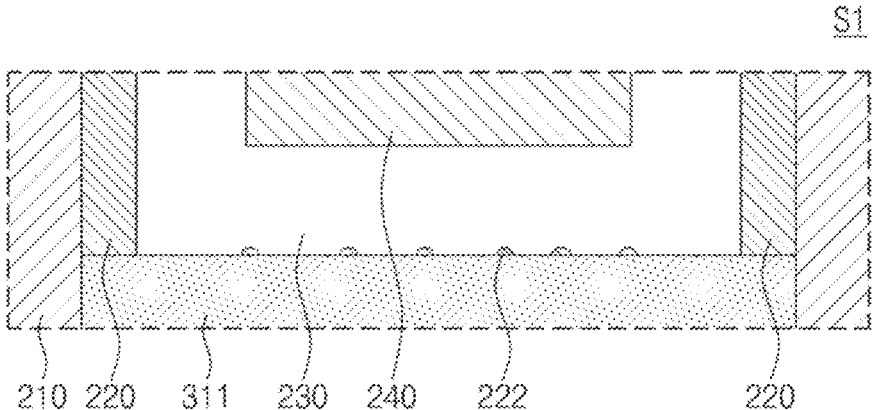
FIG. 3 is an enlarged sectional view illustrating a portion 'S1' of FIG. 2.

FIG. 1 is a plan view illustrating a semiconductor device according to an example embodiment of the inventive concept. FIG. 2 is a sectional view illustrating cross-sections of a semiconductor device according to an example embodiment of the inventive concept, taken along lines A-A' and B-B' of FIG. 1. FIG. 3 is an enlarged sectional view illustrating a portion 'S1' of FIG. 2.

Referring to FIGS. 1 to 3, a semiconductor substrate 100 may be provided. As an example, the semiconductor substrate 100 may be a single crystalline silicon substrate.

Although not shown, semiconductor elements may be provided on the semiconductor substrate 100. In detail, a device isolation layer may be disposed in the semiconductor substrate 100 to define active regions. Word lines may be buried in the semiconductor substrate 100. Impurity injection regions may be disposed in portions of the semiconductor substrate 100, which are located at both sides of the word lines, to constitute source or drain regions. Bit lines may be electrically connected to the impurity injection regions, which are located at a side of the word lines. Storage node contacts may be electrically connected to the impurity injection regions, which are not connected to the word lines. However, the inventive concept is not limited to this example, and in an embodiment, various shapes of elements or interconnection lines may be provided on the semiconductor substrate 100.

An interlayer insulating layer 101 may be provided on the semiconductor substrate 100. For example, a lower surface of the interlayer insulating layer 101 may contact an upper surface of the semiconductor substrate 100. In the case where the semiconductor elements are provided on the semiconductor substrate 100, the interlayer insulating layer 101 may be provided on the semiconductor substrate 100 to cover the semiconductor elements. The interlayer insulating layer 101 may be formed of or may include at least one of insulating materials. In an embodiment, the interlayer insulating layer 101 may be formed of or may include at least one of silicon oxide ($SiO_2$), silicon nitride (SiN), or silicon oxynitride (SiON).

Lower electrode contacts 102 may be disposed in the interlayer insulating layer 101. The lower electrode contacts 102 may be provided to penetrate the interlayer insulating layer 101 and may be electrically connected to the semiconductor substrate 100. In example embodiments, upper and lower surfaces of the lower electrode contacts 102 may be coplanar with upper and lower surfaces, respectively, of the interlayer insulating layer 101. For example, in the case where the semiconductor elements are provided on the semiconductor substrate 100, the lower electrode contacts 102 may be electrically connected to the storage node contact of the semiconductor element. The lower electrode contacts 102 may be formed of or may include a conductive material. In an embodiment, the lower electrode contacts 102 may be formed of or may include at least one of doped poly silicon, titanium nitride (TiN), or tungsten (W).

An etch stop layer 103 may be disposed on the interlayer insulating layer 101. For example, a lower surface of the etch stop layer 103 may contact an upper surface of the interlayer insulating layer 101. In an embodiment, the etch stop layer 103 may be formed of or may include at least one of silicon nitride (SiN), silicon boron nitride (SiBN), or silicon carbon nitride (SiCN) and may have a single- or multi-layered structure. In an embodiment, the etch stop layer 103 may not be provided.

Lower electrodes 210 may be disposed on the etch stop layer 103. Each of the lower electrodes 210 may be provided to penetrate the etch stop layer 103 and to be in contact with a corresponding one of the lower electrode contacts 102. The lower electrodes 210 may have a pillar shape. As an example, the lower electrodes 210 may be shaped like a plug having a circular section. The lower electrodes 210 may be horizontally spaced apart from each other. The lower electrodes 210 may be arranged in a honeycomb shape, when viewed in a plan view. For example, six lower electrodes 210 may be arranged around one lower electrode 210 to form a hexagonal shape. However, the planar arrangement of the lower electrodes 210 may be variously changed. The lower electrodes 210 may be formed of or may include a conductive material. For example, the lower electrodes 210 may be formed of or may include at least one of doped poly silicon, metal materials, metal oxide materials, or metal nitride materials.

Supporting patterns 310 may be provided on side surfaces of the lower electrodes 210. The supporting patterns 310 may include a first supporting pattern 311 and a second supporting pattern 312. The first and second supporting patterns 311 and 312 may be in contact with the side surfaces of the lower electrodes 210. The first and second supporting patterns 311 and 312 may be provided to penetrate a conductive pattern 220 and to be in contact with portions of the side surfaces of the lower electrodes 210. For example, at least a portion of the side surface of each of the lower electrodes 210 may be covered with the first and second supporting patterns 311 and 312, and a remaining portion of the side surface of each of the lower electrodes 210 may not be covered with the first and second supporting patterns 311 and 312. The first supporting pattern 311 may be vertically spaced apart from the interlayer insulating layer 101 or the etch stop layer 103. The first supporting pattern 311 may be placed over the etch stop layer 103. The second supporting pattern 312 may be vertically spaced apart from the first supporting pattern 311. The second supporting pattern 312 may be placed over the first supporting pattern 311. The first supporting pattern 311, the second supporting pattern 312, and the etch stop layer 103 may vertically overlap one another. A top surface of the second supporting pattern 312 may be located at a level higher than a top surface of the first supporting pattern 311, when measured from the semiconductor substrate 100. The top surface of the second supporting pattern 312 may be coplanar with top surfaces of the lower electrodes 210. For example, the top surface of the second supporting pattern 312 and the top surfaces of the lower electrodes 210 may be located on a single plane and may be connected to each other. The first and second supporting patterns 311 and 312 may connect the side surfaces of the lower electrodes 210 to each other. The lower electrodes 210 may be supported by the first and second supporting patterns 311 and 312. For example, the first and second supporting patterns 311 and 312 may prevent the lower electrodes 210 from leaning laterally. The first and second supporting patterns 311 and 312 may contain carbon (C). Here, a content of carbon (C) in the first supporting pattern 311 and a content of carbon (C) in the second supporting pattern 312 may be higher than a content of carbon (C) in the lower electrodes 210. In the case where the lower electrodes 210 contain carbon (C), the content of carbon (C) in the lower electrodes 210 may be lower than 5 at %. In an embodiment, the lower electrodes 210 may not contain carbon (C), or the content of carbon (C) in the lower electrodes 210 may be a very small value that is substantially close to zero. The content of carbon (C) in each of the first and second supporting patterns 311 and 312 may range from 5 at % to 10 at %. In an embodiment, the first and second supporting patterns 311 and 312 may be formed of or may include silicon carbon nitride (SiCN).

The supporting patterns 310 may have supporting holes 300$h$. For example, the supporting holes 300$h$ may include first supporting holes 301$h$, which are provided to penetrate the first supporting pattern 311, and second supporting holes 302$h$, which are provided to penetrate the second supporting pattern 312. When viewed in a plan view, positions of the first supporting holes 301$h$ may correspond to positions of the second supporting holes 302$h$. For example, each of the first supporting holes 301$h$ may be vertically overlapped with a corresponding one of the second supporting holes 302$h$. The first and second supporting holes 301$h$ and 302$h$ may be formed to partially expose side surfaces of three lower electrodes 210, which are disposed to be adjacent to each other.

FIG. 2 illustrates an example, in which two vertically-separated supporting patterns (e.g., the first and second supporting patterns 311 and 312) are provided on the semiconductor substrate 100, but the inventive concept is not limited to this example. For example, the number of the supporting patterns may be one or may be greater than two. The description that follows will be based on the embodiment of FIG. 2.

The conductive pattern 220 may be provided to cover portions of the top and side surfaces of the lower electrodes 210, which are not in contact with the first and second supporting patterns 311 and 312. However, the conductive pattern 220 may be provided to expose the first and second supporting patterns 311 and 312. For example, the conductive pattern 220 may contact the top and side surfaces of the lower electrodes 210. In addition, the conductive pattern 220 may be provided to expose the etch stop layer 103. When viewed in the plan view of FIG. 1, the conductive pattern 220 may be located within the supporting holes 300$h$. An adhesion strength between the lower electrodes 210 and the first and second supporting patterns 311 and 312 may be greater than an adhesion strength between the conductive pattern 220 and the first and second supporting patterns 311 and 312. The conductive pattern 220 may be formed to have a substantially uniform thickness. The conductive pattern 220 may be formed of or may include at least one of conductive materials. For example, the conductive pattern 220 may be formed of or may include at least one of niobium (Nb), tantalum (Ta), tin (Sn), molybdenum (Mo), titanium (Ti), indium (In), nickel (Ni), cobalt (Co), tungsten (W), or ruthenium (Ru). A work function of the conductive pattern 220 may be greater than a work function of the lower electrodes 210.

Referring to FIG. 3, conductive islands 222 may be disposed on the top surface of the first supporting pattern 311. The conductive islands 222 may be distributed on the top surface of the first supporting pattern 311. In some embodiments, the conductive islands 222 may be distributed on the top surface of the first supporting pattern 311 in an irregular manner. The conductive islands 222 may be different from each other in shape and size. Distances between the conductive islands 222 may be different from each other. The conductive islands 222 may be spaced apart from each other in a horizontal direction. The conductive islands 222 may be spaced apart from the conductive pattern 220 in the horizontal direction. Accordingly, the conductive islands 222 may be electrically disconnected from the conductive pattern 220. For example, the conductive islands 222 may be electrically isolated from the conductive pattern 220. The conductive islands 222 may be provided to expose at least a portion of the top surface of the first supporting pattern 311. The conductive islands 222 may be formed of or may include the same material as the conductive pattern 220. For example, the conductive islands 222 may be formed of or may include at least one of niobium (Nb), tantalum (Ta), tin (Sn), molybdenum (Mo), titanium (Ti), indium (In), nickel (Ni), cobalt (Co), tungsten (W), or ruthenium (Ru).

The enlarged sectional view of FIG. 3 shows the conductive islands 222 provided on the top surface of the first supporting pattern 311, but the inventive concept is not limited to this example. For example, the conductive islands 222 may be provided on the top, bottom, and side surfaces of the supporting patterns 310, except for surfaces in contact with the lower electrodes 210.

Although not shown, the conductive islands 222 may be provided on a surface of the second supporting pattern 312. For example, the conductive islands 222 may be provided on a surface of the first supporting pattern 311 and/or on a surface of the second supporting pattern 312. The arrangement and shapes of the conductive islands 222 provided on the surface of the second supporting pattern 312 may be substantially the same or similar to those of the conductive islands 222 on the top surface of the first supporting pattern 311, described with reference to FIG. 3. For example, the conductive islands 222 may be irregularly distributed on a surface of the second supporting pattern 312, and the conductive islands 222 may be spaced apart from each other and from the conductive pattern 220.

A dielectric layer 230 may be disposed on the conductive pattern 220, the conductive islands 222, the first supporting pattern 311, and the second supporting pattern 312. The dielectric layer 230 may be formed to conformally cover the conductive pattern 220, the first supporting pattern 311, and the second supporting pattern 312. For example, the dielectric layer 230 may cover the conductive pattern 220, conductive island 222, the first supporting pattern 311, and the second supporting pattern 312 with a uniform thickness. The dielectric layer 230 on the first and second supporting patterns 311 and 312 may cover the conductive islands 222, and the conductive islands 222 may not be exposed by the dielectric layer 230. The dielectric layer 230 may contact surfaces of the conductive pattern 220, the first supporting pattern 311, and the second supporting pattern 312. The dielectric layer 230 may be spaced apart from the lower electrodes 210 with the conductive pattern 220 interposed therebetween. Due to the conductive pattern 220, the dielectric layer 230 may not be in contact with the lower electrodes 210. The dielectric layer 230 may be formed of or may include at least one of dielectric materials. For example, the dielectric layer 230 may be formed of or may include a material having a dielectric constant higher than silicon oxide ($SiO_2$) or silicon nitride (SiN). For example, the dielectric layer 230 may be formed of or may include at least one of metal oxide materials (e.g., aluminum oxide ($Al_2O_3$), zirconium oxide ($ZrO_2$), and hafnium oxide ($HfO_2$)), and may have a single- or multi-layered structure.

An upper electrode 240 may be disposed on the dielectric layer 230. The upper electrode 240 may contact the dielectric layer 230. The upper electrode 240 on the dielectric layer 230 may cover the lower electrodes 210. The upper electrode 240 may be spaced apart from the lower electrodes 210 by the dielectric layer 230. In addition, the upper electrode 240 may be spaced apart from the conductive islands 222, which are provided on the first and second supporting patterns 311 and 312, by the dielectric layer 230. The upper electrode 240 may be formed of or may include at least one of metallic materials (e.g., titanium nitride (TiN) and tungsten (W)) or doped poly silicon, and may have a single- or multi-layered structure. The lower electrodes 210, the dielectric layer 230, and the upper electrode 240 may constitute a capacitor.

In a semiconductor device according to an example embodiment of the inventive concept, the conductive pattern 220 may be provided to cover the top surfaces of the lower electrodes 210 and the side surfaces of the lower electrodes 210, which are not in contact with the first and second supporting patterns 311 and 312. Here, the conductive pattern 220 may be formed of or may include a material having a higher work function than the lower electrodes 210. Thus, due to the high work function of the conductive pattern 220, an emission of electrons from the conductive pattern 220 to the outside of the conductive pattern 220 may be suppressed, and thereby a leakage current from the conductive pattern 220 may be reduced. That is, in the case where the conductive pattern 220 having a relatively high work function is disposed on the lower electrodes 210 and the dielectric layer 230 is spaced apart from the lower electrodes 210 having a relatively low work function, it may be possible to prevent or suppress electrons, which are stored in the lower electrodes 210, from being leaked to the outside through the dielectric layer 230. Thus, it may be possible to reduce a leakage current in the semiconductor device and thereby to improve a data or electron retention property of the semiconductor device. Furthermore, since the conductive patterns 220 covering the lower electrodes 210 are disconnected from each other, it may be possible to prevent a short circuit from being formed between the lower electrodes 210. As a result, the semiconductor device may have improved electrical characteristics.

Furthermore, since the first and second supporting patterns 311 and 312 are disposed to be in contact with the lower electrodes 210, it may be possible to prevent the lower electrodes 210 from leaning or collapsing, and thereby to improve reliability characteristics of the semiconductor device.

Figure 4:
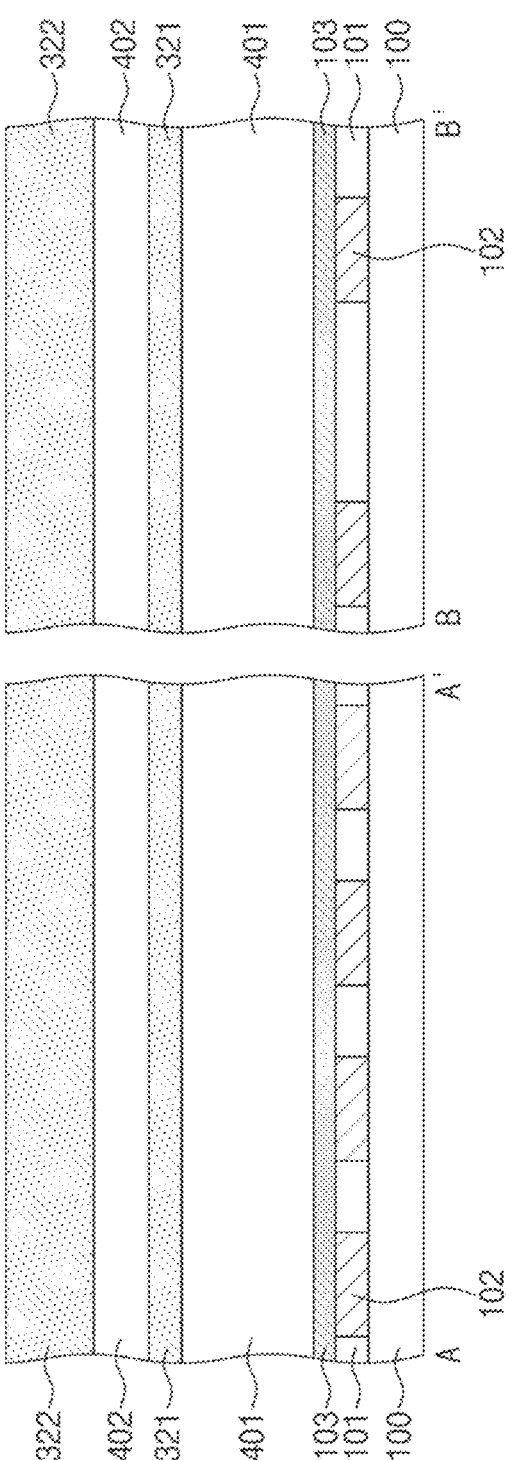
Figure 5:
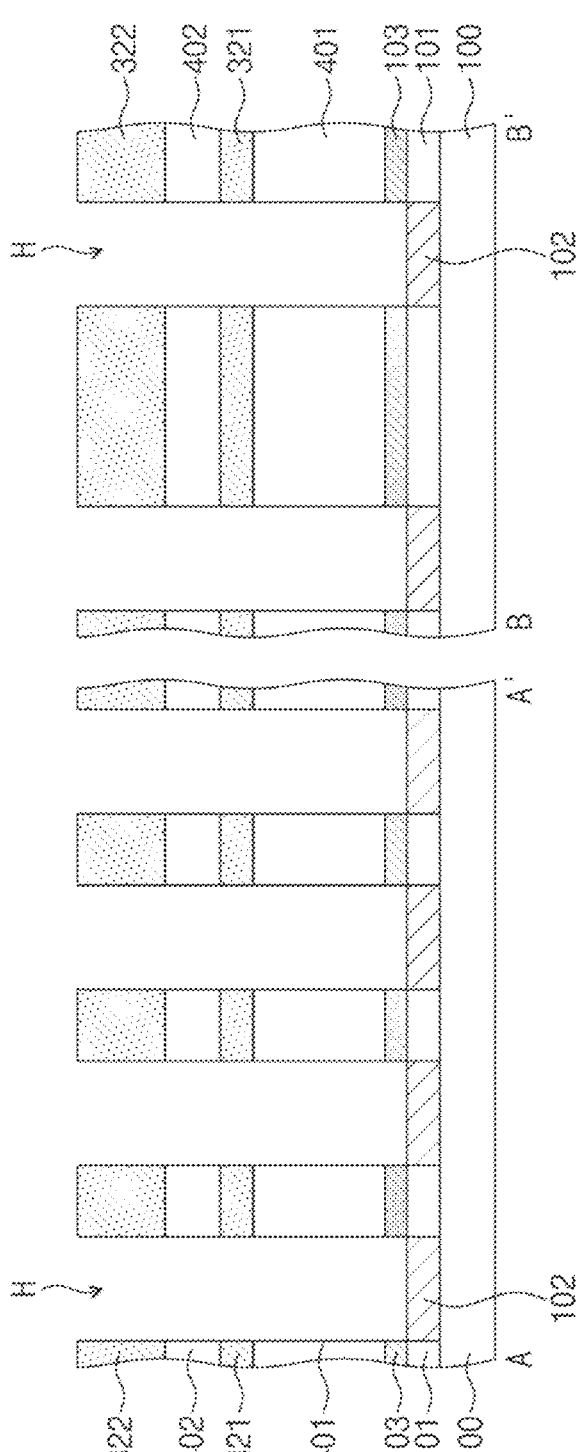
Figure 6:
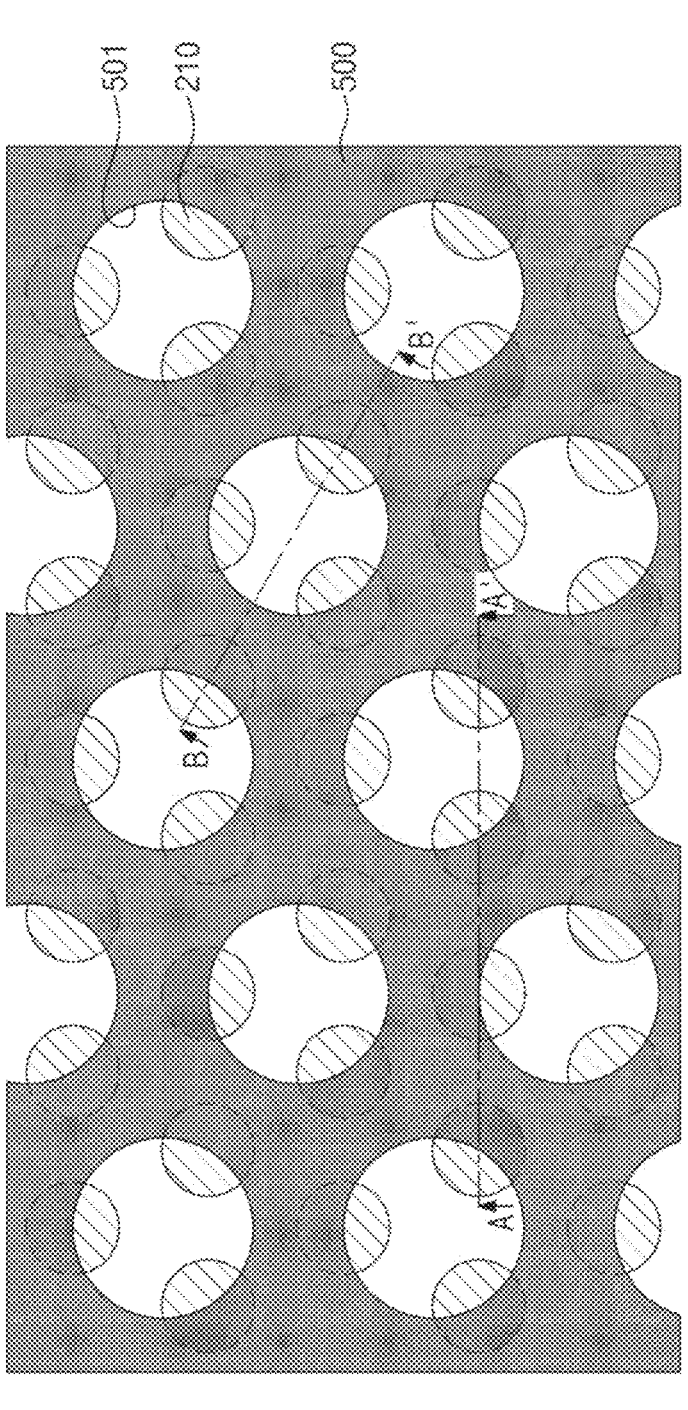
Figure 9:
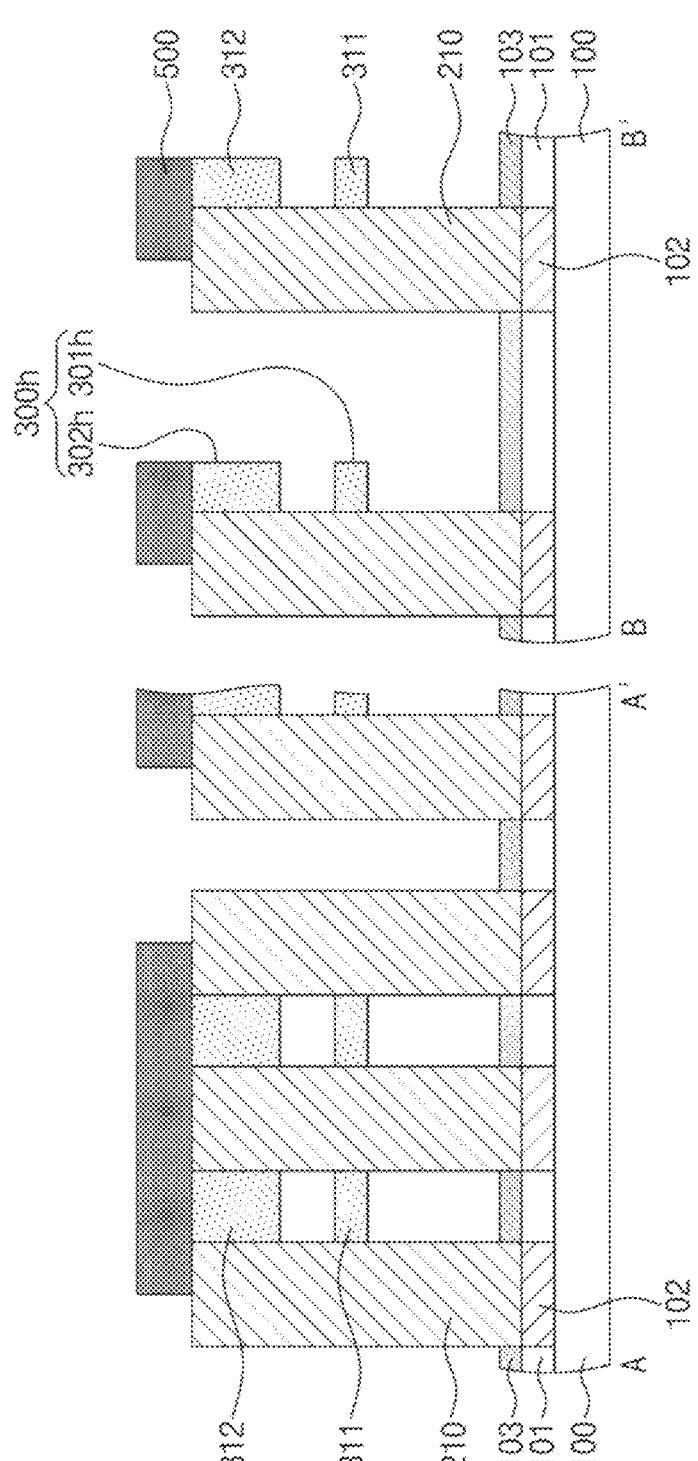
Figure 10:
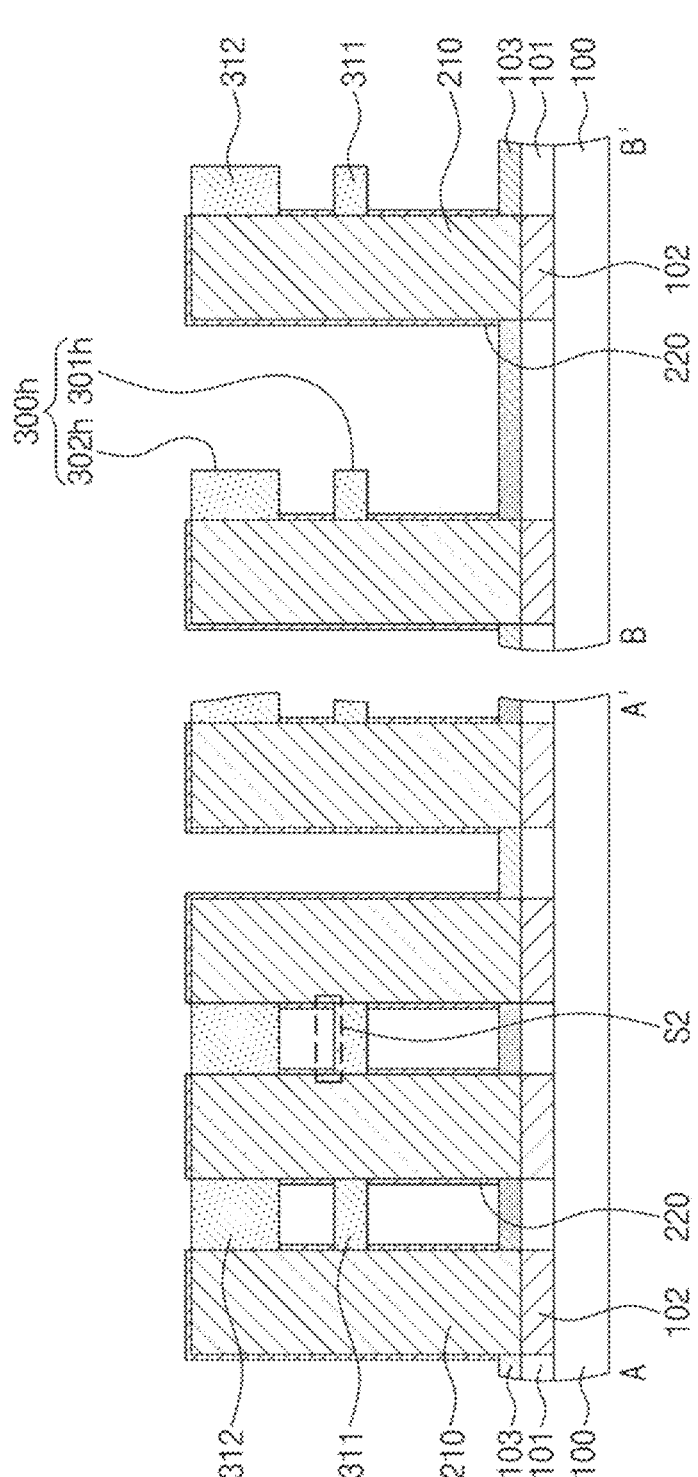
Figure 11:
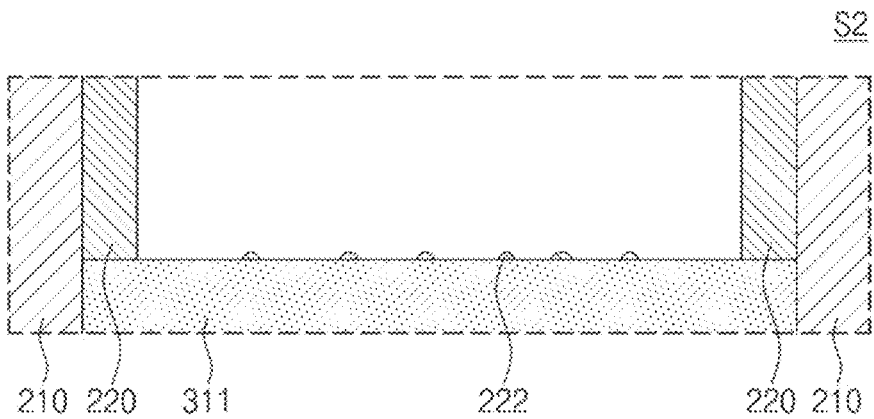
Figure 12:
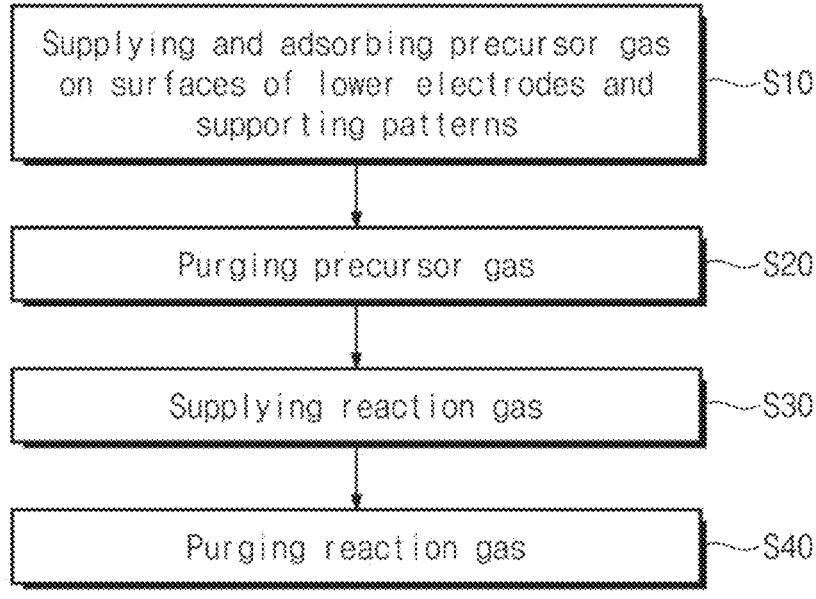

FIGS. 4 to 13 are diagrams that are presented to describe a method of fabricating a semiconductor device according to an example embodiment of the inventive concept. In detail, FIG. 6 is a plan view, which is presented to describe some steps of the example fabrication method. FIG. 11 is an enlarged sectional view illustrating a portion 'S2' of FIG. 10. FIG. 12 is a flow chart, which is presented to describe some steps of the example fabrication method. In the following description, an element previously described with reference to FIGS. 1 to 3 may be identified by the same reference number without repeating an overlapping description thereof.

Referring to FIG. 4, the semiconductor substrate 100 may be provided. Although not shown, semiconductor elements or interconnection lines may be formed on the semiconductor substrate 100 through a conventional process.

The interlayer insulating layer 101 may be formed on the semiconductor substrate 100. The interlayer insulating layer 101 on the semiconductor substrate 100 may cover the semiconductor elements or the interconnection lines.

The lower electrode contacts 102 may be formed in the interlayer insulating layer 101. For example, the formation of the lower electrode contacts 102 may include forming openings to vertically penetrate the interlayer insulating layer 101 and filling the openings with a conductive material. In an embodiment, the lower electrode contacts 102 may be electrically connected to the semiconductor elements.

The etch stop layer 103 may be formed on the interlayer insulating layer 101 and the lower electrode contacts 102. The etch stop layer 103 on the interlayer insulating layer 101 may cover the lower electrode contacts 102.

Sacrificial layers 401 and 402 and supporting layers 321 and 322 may be formed on the etch stop layer 103. The formation of the sacrificial layers 401 and 402 and the supporting layers 321 and 322 may include sequentially stacking a first sacrificial layer 401, a first supporting layer 321, a second sacrificial layer 402, and a second supporting layer 322.

In an embodiment, the first and second sacrificial layers 401 and 402 may be formed of the same material. The first and second supporting layers 321 and 322 may be formed of the same material. The first and second sacrificial layers 401 and 402 may be formed of or may include a material having an etch selectivity with respect to the first and second supporting layers 321 and 322. For example, the first and second sacrificial layers 401 and 402 may be formed of or may include silicon oxide ($SiO_2$). The first and second supporting layers 321 and 322 may include carbon (C). The carbon concentration of the first and second supporting layers 321 and 322 may range from 5 at % to 10 at %. As an example, the first and second supporting layers 321 and 322 may be formed of or may include silicon carbon nitride (SiCN).

Referring to FIG. 5, the second supporting layer 322, the second sacrificial layer 402, the first supporting layer 321, and the first sacrificial layer 401 may be sequentially etched to form lower electrode holes H exposing the lower electrode contacts 102. For example, the lower electrode holes H may be formed by forming a mask pattern on the second supporting layer 322 and performing an etching process using the mask pattern as an etch mask. Thereafter, the mask pattern may be removed.

Figure 7:
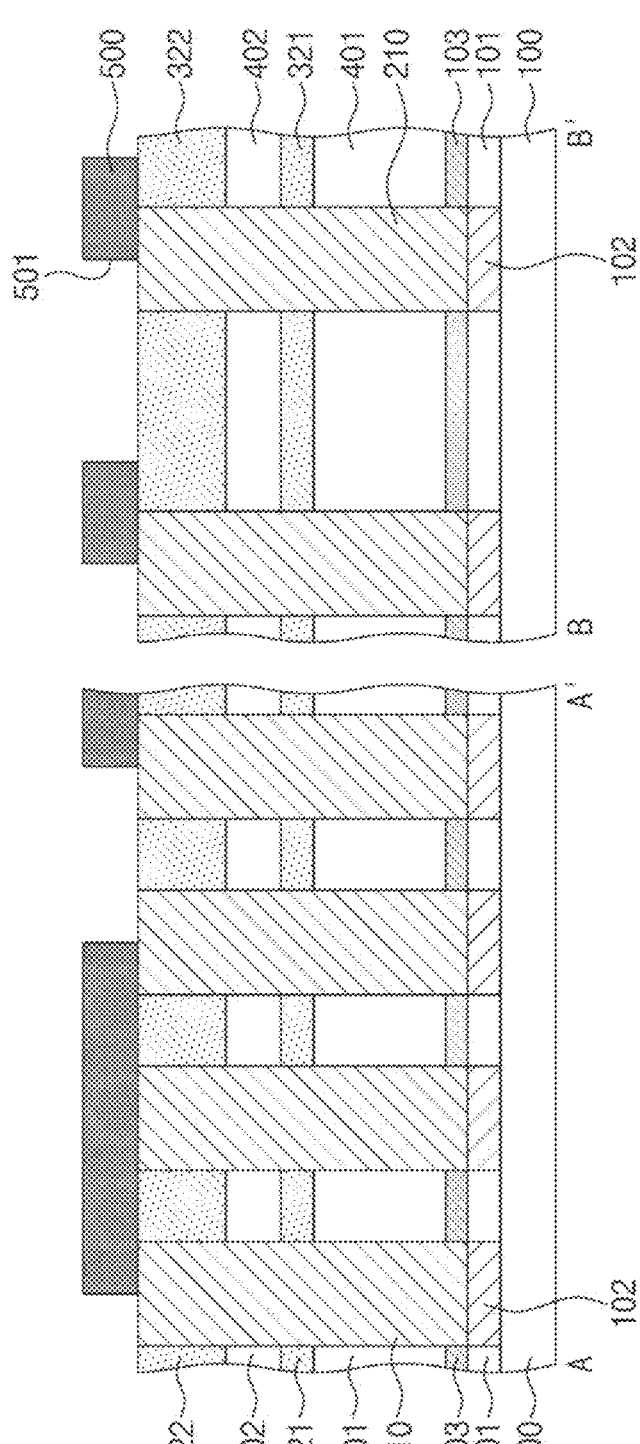

Referring to FIGS. 6 and 7, the lower electrodes 210 may be formed in the lower electrode holes H. For example, the formation of the lower electrodes 210 may include forming a conductive layer on the semiconductor substrate 100 to fill the lower electrode holes H and performing an etch-back process on the conductive layer. The etch-back process may be performed until a top surface of the conductive layer is located at the same level as a top surface of the second supporting layer 322. As a result, the conductive layer may be divided into a plurality of portions, which are respectively placed in the lower electrode holes H, and the lower electrodes 210 may be composed of the portions of the conductive layer. As a result of the etch-back process, the conductive layer on the top surface of the second supporting layer 322 may be removed, and thus, the top surface of the second supporting layer 322 may be exposed to the outside.

A mask pattern 500 may be formed on the second supporting layer 322. The mask pattern 500 may include openings 501, each of which is formed to partially expose the top surfaces of the lower electrodes 210. In an embodiment, each of the openings 501 may be formed to partially expose top surfaces of three adjacent lower electrodes 210 and a top surface of the second supporting layer 322 therebetween.

Figure 8:
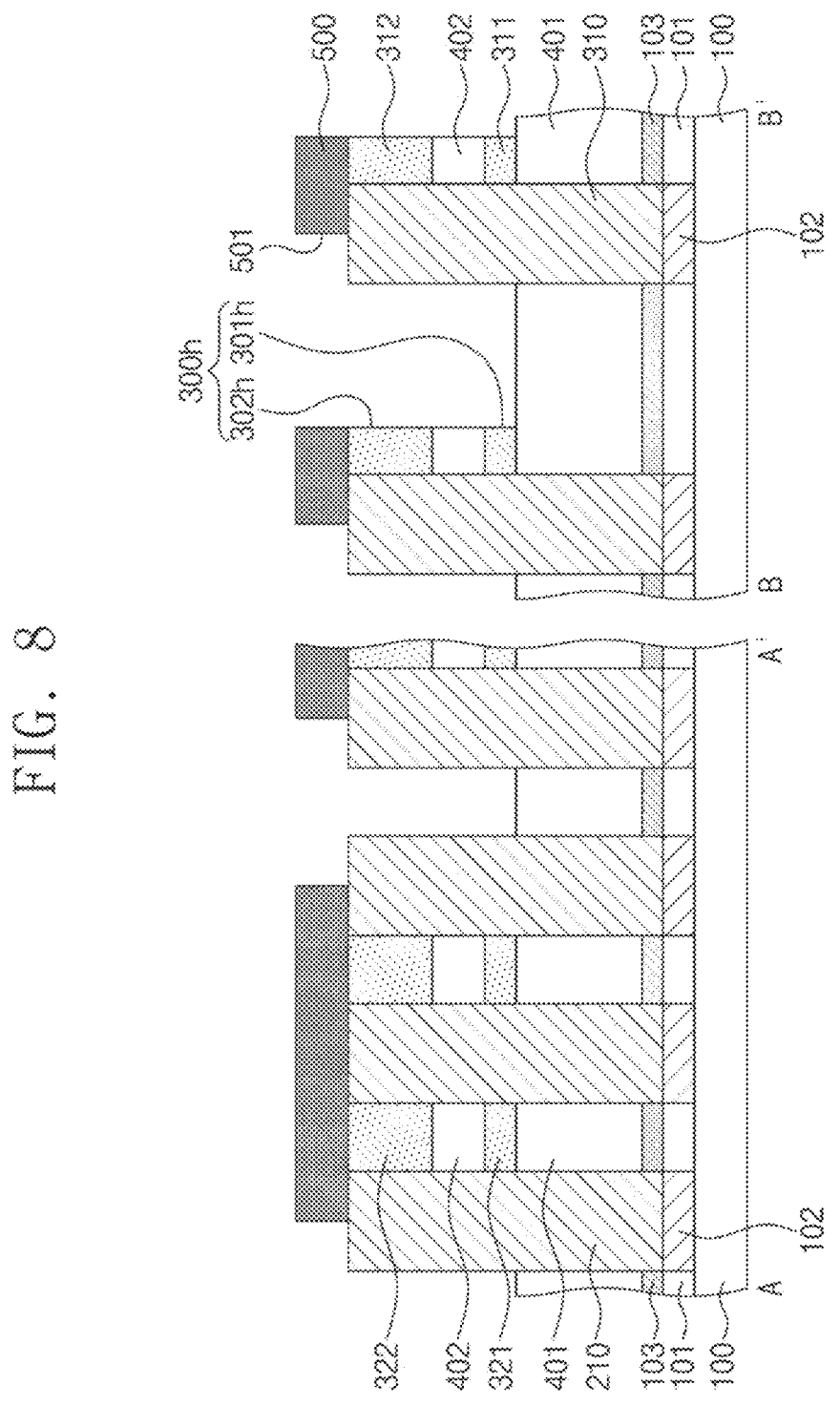

Referring to FIG. 8, the second supporting layer 322 and the first supporting layer 321 may be patterned to form the supporting patterns 310 including the supporting holes 300h. In detail, an etching process may be performed using the mask pattern 500 as an etch mask. The etching process may include an anisotropic etching process. The etching process may be performed to sequentially etch the second supporting layer 322, which is exposed by the openings 501 of the mask pattern 500, the second sacrificial layer 402 below the second supporting layer 322, and the first supporting layer 321 below the second sacrificial layer 402. As a result of this process, the supporting holes 300h may be formed to expose a top surface of the first sacrificial layer 401. As a result of the patterning of the first supporting layer 321, the first supporting pattern 311 having the first supporting holes 301h may be formed. As a result of the patterning of the second supporting layer 322, the second supporting pattern 312 having the second supporting holes 302h may be formed. Since the etching process is performed by the anisotropic etching process, the first and second supporting holes 301h and 302h may be vertically overlapped with each other and may be the same or similar to each other in shape and size. In addition, a side surface of the second sacrificial layer 402 may also be exposed to the supporting hole 300h.

Referring to FIG. 9, the first and second sacrificial layers 401 and 402 may be removed. The first and second sacrificial layers 401 and 402 may be formed by an isotropic etching process. For example, an etching solution may be supplied to the first and second sacrificial layers 401 and 402 through the first and second supporting holes 301h and 302h, and in this case, the exposed side surface of the second sacrificial layer 402 and the exposed top surface of the first sacrificial layer 401 may react with the etching solution. Since the first and second sacrificial layers 401 and 402 are removed, a top surface of the etch stop layer 103, top and bottom surfaces of the first supporting pattern 311, and a bottom surface of the second supporting pattern 312 may be exposed.

Alternatively, an anisotropic etching process may be performed on the second supporting layer 322 to form the second supporting pattern 312 including the second supporting holes 302h, and then, an isotropic etching process may be performed to remove the second sacrificial layer 402 through the second supporting holes 302h. Thereafter, an anisotropic etching process may be performed on the first supporting layer 321 to form the first supporting pattern 311 including the first supporting holes 301h, and then, an isotropic etching process may be performed to remove the first sacrificial layer 401 through the first supporting holes 301h.

Referring to FIGS. 10 to 12, the mask pattern 500 (e.g., see FIG. 8) may be removed. The process of depositing the conductive pattern 220 may be performed after the removal of the mask pattern 500.

The conductive pattern 220 may be formed by an area selective deposition method. In an embodiment, the conductive pattern 220 may be formed on only exposed surfaces of the lower electrodes 210. For example, the conductive pattern 220 may be deposited using a self-limiting surface chemical reaction. In an embodiment, the conductive islands 222 may be formed on exposed surfaces of the first and second supporting patterns 311 and 312, when the conductive pattern 220 is formed. For example, the conductive pattern 220 and the conductive islands 222 may be formed by the same deposition process. Hereinafter, a process of forming the conductive pattern 220 will be described in more detail below.

The deposition of the conductive pattern 220 may include repeating a single process cycle. The single cycle in the process of forming the conductive pattern 220 may include a first step S10 of supplying and adsorbing a precursor gas on surfaces of the lower electrodes 210 and the supporting patterns 310, including the first supporting pattern 311 and the second supporting pattern 312, a second step S20 of purging the precursor gas, a third step S30 of supplying a reaction gas, and a fourth step S40 of purging the reaction gas. Hereinafter, each step of the single cycle will be described in more detail.

In the first step S10, a source gas containing a precursor material may be supplied. Reactivity between the precursor material and exposed surfaces of the supporting patterns 310 may be smaller than reactivity between the precursor material and exposed surfaces of the lower electrodes 210. For example, the precursor material may be adsorbed on the exposed surfaces of the lower electrodes 210. The exposed surfaces of the lower electrodes 210 may be saturated with the precursor material. The precursor material may be adsorbed on the entire exposed surfaces of the lower electrodes 210. As a result of the adsorption of the precursor material, a layer containing the precursor material may be formed on the exposed surfaces of the lower electrodes 210. Here, the precursor material may also be adsorbed on the exposed surfaces of the supporting patterns 310. Nevertheless, the exposed surfaces of the supporting patterns 310 may not be saturated with the precursor material. The precursor material may be locally adsorbed on the exposed surfaces of the supporting patterns 310.

In the second step S20, the source gas of the precursor material, which is not adsorbed on the lower electrodes 210 and the supporting patterns 310, may be exhausted from a deposition chamber.

In the third step S30, the reaction gas, which is used for reaction with the precursor material, may be supplied into the chamber. The precursor material, which is adsorbed on the lower electrodes 210, may react with the reaction gas, and as a result, the conductive pattern 220 may be formed to cover the exposed surfaces of the lower electrodes 210. For example, since the precursor material is formed on the exposed surfaces of the lower electrodes 210 in the form of an adsorption layer, at least one atomic layer constituting the conductive pattern 220 may be formed on the exposed surfaces of the lower electrodes 210. The lower electrodes 210 may not be exposed to the outside by the conductive pattern 220.

The precursor material, which is adsorbed on the supporting patterns 310, may react with the reaction gas, and in this case, the conductive islands 222, which are spaced apart from each other, may be formed. For example, since the precursor material is locally adsorbed on the exposed surfaces of the supporting patterns 310, the conductive islands 222 may be formed on the supporting patterns 310 in a scattered or distributed manner. For example, the conductive islands 222 may be formed to partially cover the supporting patterns 311 and 312 and to expose at least a portion of the supporting patterns 311 and 312.

The conductive islands 222 on the supporting patterns 310 may be formed to have various shapes and various sizes. The conductive islands 222 on the supporting patterns 310 may be spaced apart from each other by various distances. For example, the conductive islands 222 may be formed to have irregular shapes and arrangement on the supporting patterns 310. The conductive islands 222 may be formed to be spaced apart from the conductive pattern 220 on the lower electrodes 210. Thus, the conductive islands 222 may be electrically disconnected from the conductive pattern 220. For example, the conductive islands 222 may be electrically isolated from the conductive pattern 220.

In the fourth step S40, an unreacted portion of the reaction gas, which did not participate in the third step, and by-products may be exhausted from the deposition chamber.

The deposition process of the conductive pattern 220 and the conductive islands 222 may be performed using a precursor material containing a metallic element. The precursor material may include niobium (Nb), tantalum (Ta), tin (Sn), molybdenum (Mo), titanium (Ti), indium (In), nickel (Ni), cobalt (Co), tungsten (W), or ruthenium (Ru). The second step S20 and the fourth step S40 may be performed by a process using an inert gas. The deposition process may be performed at a temperature of 250° C. to 700° C.

The supporting patterns 310 may include a specific material having a low chemical reactivity with the precursor material. For example, the supporting patterns 310 may include carbon (C). A carbon concentration of the supporting patterns 310 may range from 5 at % to 10 at %. The carbon concentration of the supporting pattern 310 may be higher than a carbon concentration of the lower electrode 210. In an embodiment, the supporting patterns 310 may be formed of or may include silicon carbon nitride (SiCN).

According to the above description of the process cycle in the deposition process, the conductive pattern 220 and the conductive islands 222 are formed during each cycle, but the inventive concept is not limited to this example.

In the case where a metal material is deposited by the area selective atomic layer deposition method according to an embodiment of the inventive concept, the reaction between the reaction gas and the precursor material may occur after the precursor material is adsorbed on a surface of a target layer. Here, the process cycle may be repeated when the deposition process is within a period from an initial state to a state, in which the deposition of the precursor material on the surface is started. The time interval, in which the process cycle of the deposition process is repeated from the initial state until the deposition of the precursor material is started, may be referred to as an incubation period. Due to the difference in concentration of the specific material between the lower electrode 210 and the supporting pattern 310, the lower electrode 210 and the supporting pattern 310 may have incubation periods that are different from each other. The incubation period, which is needed to deposit the precursor material on the lower electrodes 210, may be shorter than the incubation period, which is needed to deposit the precursor material on the supporting patterns 310. Thus, the number of the cycles, which are repeated to form a single atomic layer on the lower electrodes 210, may be less than the number of the cycles, which are repeated to form a single atomic layer on the supporting patterns 310, and a deposition rate of the precursor material on the lower electrodes 210 may be faster than a deposition rate of the precursor material on the supporting patterns 310. In the present specification, the single atomic layer may mean a monolayer, which is formed to have a thickness that is close to a size of an atom constituting the conductive pattern 220. The deposition process may be performed during the process time that is longer than the incubation period of the lower electrodes 210 and is shorter than the incubation period of the supporting patterns 310. The deposition process may be terminated before the single atomic layer is formed on the surfaces of the supporting patterns 310. Thus, the precursor material may be selectively deposited on regions between the lower electrodes 210 and the supporting patterns 310.

According to an embodiment of the inventive concept, by using an area selective deposition process, it may be possible to selectively form the conductive pattern 220 on only the top surfaces of the lower electrodes 210 and the side surfaces of the lower electrodes 210, which are not in contact with the supporting patterns 310. By contrast, the conductive islands 222 may be formed on the surfaces of the supporting patterns 310 and may be spaced apart from the conductive patterns 220, which are formed on the lower electrodes 210. Thus, it may be possible to omit an additional process of removing the conductive pattern 220 from the surfaces of the supporting patterns 310, and the conductive patterns 220, which are formed on the lower electrodes 210, may be spaced apart from each other. Accordingly, it may be possible to prevent a short circuit from being formed between the lower electrodes 210. In addition, it may be possible to simplify the process of fabricating the semiconductor device and to reduce fabrication cost of the semiconductor device.

Figure 13:
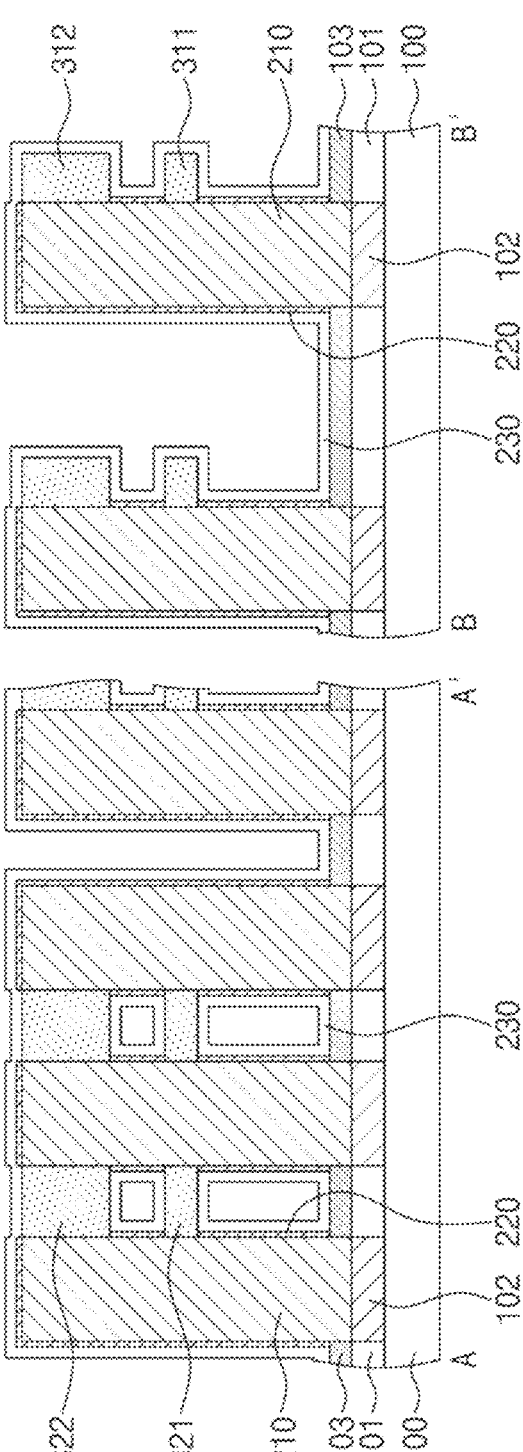

Referring to FIG. 13, the dielectric layer 230 may be formed on the conductive pattern 220, the first supporting pattern 311, the second supporting pattern 312, and the etch stop layer 103. The dielectric layer 230 may be formed on the conductive pattern 220 and the etch stop layer 103 to have a uniform thickness. The dielectric layer 230 may be formed to cover the conductive islands 222 on the supporting patterns 310. The dielectric layer 230 may not expose the conductive islands 222 on the supporting patterns 310. The dielectric layer 230 may be the same dielectric layer as the dielectric layer 230 described with reference to FIG. 2.

Referring back to FIG. 2, the upper electrode 240 may be formed on the dielectric layer 230. For example, the upper electrode 240 may be formed by depositing or coating a conductive material on the semiconductor substrate 100. The upper electrode 240 may be formed on the dielectric layer 230 to cover the lower electrodes 210. The upper electrode 240 may be formed to be spaced apart from the lower electrodes 210 by the dielectric layer 230.

Figure 14:
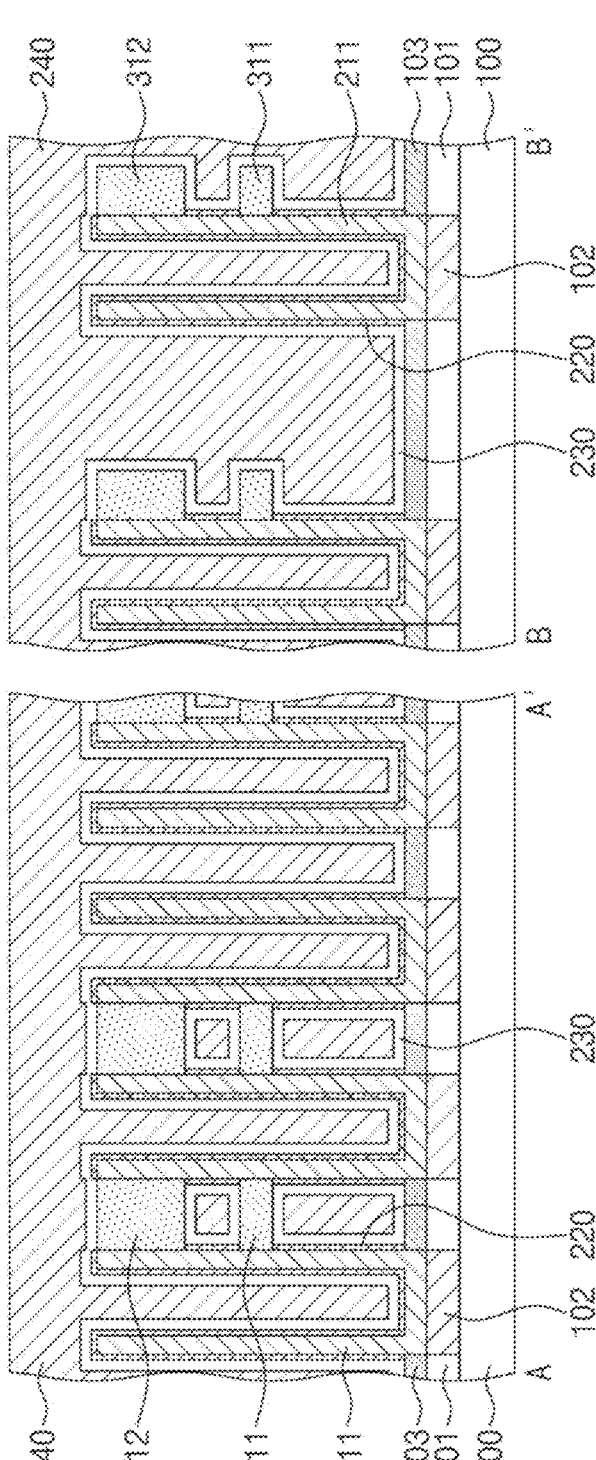
FIGS. 14 and 15 are sectional views illustrating a method of fabricating a semiconductor device, according to an example embodiment of the inventive concept.

FIG. 14 is a sectional view illustrating a semiconductor device according to an example embodiment of the inventive concept. In the following description of the present embodiment, an element, which has substantially the same features as that in the semiconductor device of FIG. 2, may be identified by a similar or identical reference number without repeating an overlapping description thereof, for the sake of brevity.

Referring to FIG. 14, each of lower electrodes 211 may be provided in a shape of a hollow cup or a cylinder. For example, each of lower electrodes 211 may have a U-shape when viewed in cross-section. The conductive pattern 220 may cover top surfaces, inner side surfaces, and outer side surfaces of the lower electrodes 211, and here, the outer side surfaces of the lower electrodes 211, which are covered with the conductive pattern 220, may not be in contact with the supporting patterns 311 and 312. The dielectric layer 230 may be formed to cover the conductive pattern 220. Although not shown in FIG. 14, the conductive islands 222 described with reference to FIG. 3 may be formed on exposed surfaces of the supporting patterns 311 and 312, which are not in contact with the lower electrodes 210. The dielectric layer 230 may be formed to cover the conductive pattern 220 and the supporting patterns 311 and 312. The upper electrode 240 may be formed on the dielectric layer 230. A portion of the upper electrode 240 may be extended into an inner empty space of the lower electrodes 211.

Figure 15:
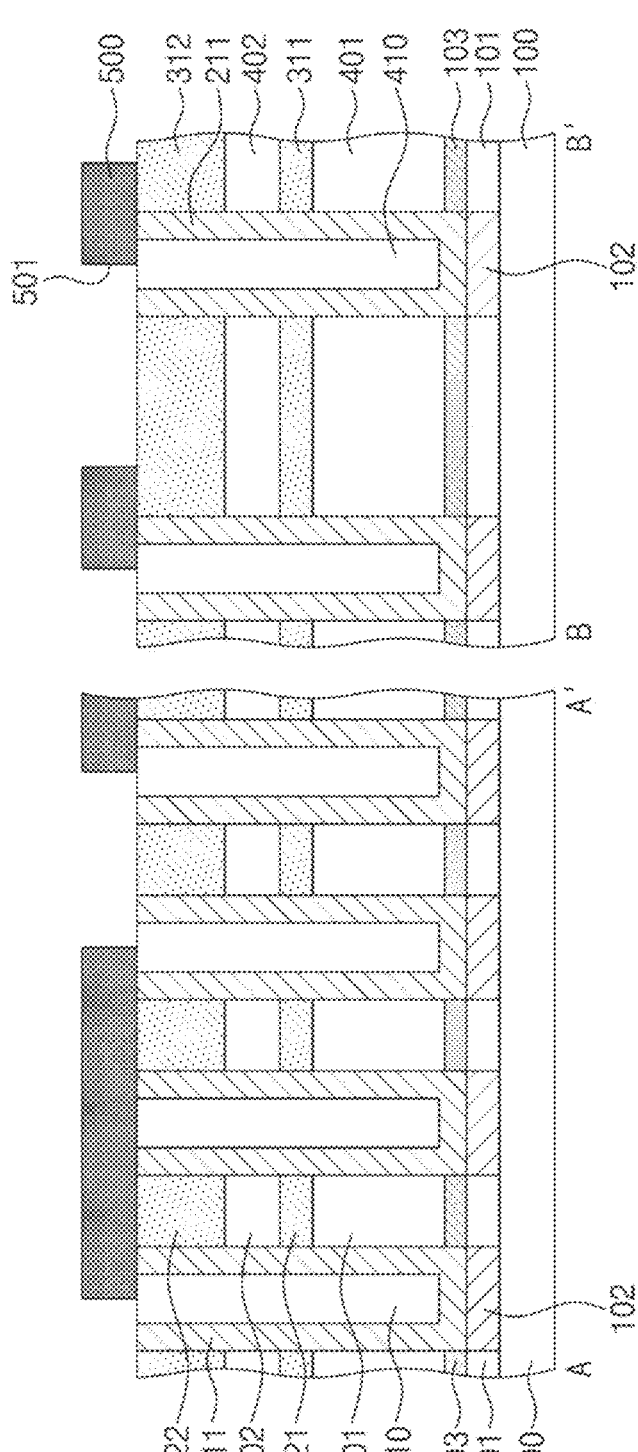

FIG. 15 is a sectional view illustrating a method of fabricating a semiconductor device (e.g., of FIG. 14) according to an example embodiment of the inventive concept.

Referring to FIG. 15, an electrode layer (not shown) may be formed on the semiconductor substrate 100 to cover the resulting structure of FIG. 5 (in particular, bottom and side surfaces of the lower electrode holes H) with a uniform thickness. Here, the thickness of the electrode layer may be relatively small such that the entireties of the lower electrode holes H are not filled with the electrode layer. A sacrificial material 410 may be formed on the electrode layer to fill the remaining portions of the lower electrode holes H. Thereafter, an etch-back or CMP process may be performed on the sacrificial material 410 and the electrode layer to expose the second supporting layer 322 and to leave portions of the electrode layer and portions of the sacrificial material 410 in the lower electrode holes H. The portions of the electrode layer, which are left in the lower electrode holes H, may be used as the lower electrodes 211, respectively.

A subsequent process may be performed in the same manner as that described with reference to FIGS. 8 to 13. In the step described with reference to FIG. 9, the sacrificial material 410 and the sacrificial layers 401 and 402 may be simultaneously removed to expose the inner side surfaces of the lower electrodes 211. Thus, during the process of forming the conductive pattern 220 of FIG. 10, the conductive pattern 220 may be deposited on the inner side surfaces of the lower electrodes 211 by, for example, an area selective deposition method. The conductive islands 222 described with reference to FIG. 11 may be formed during the deposition process of the conductive pattern 220. Subsequent processes of forming the dielectric layer 230 (e.g., see FIG. 13) and the process of forming the upper electrode 240 (e.g., see FIG. 13) may be performed using the methods described above.

Figure 16:
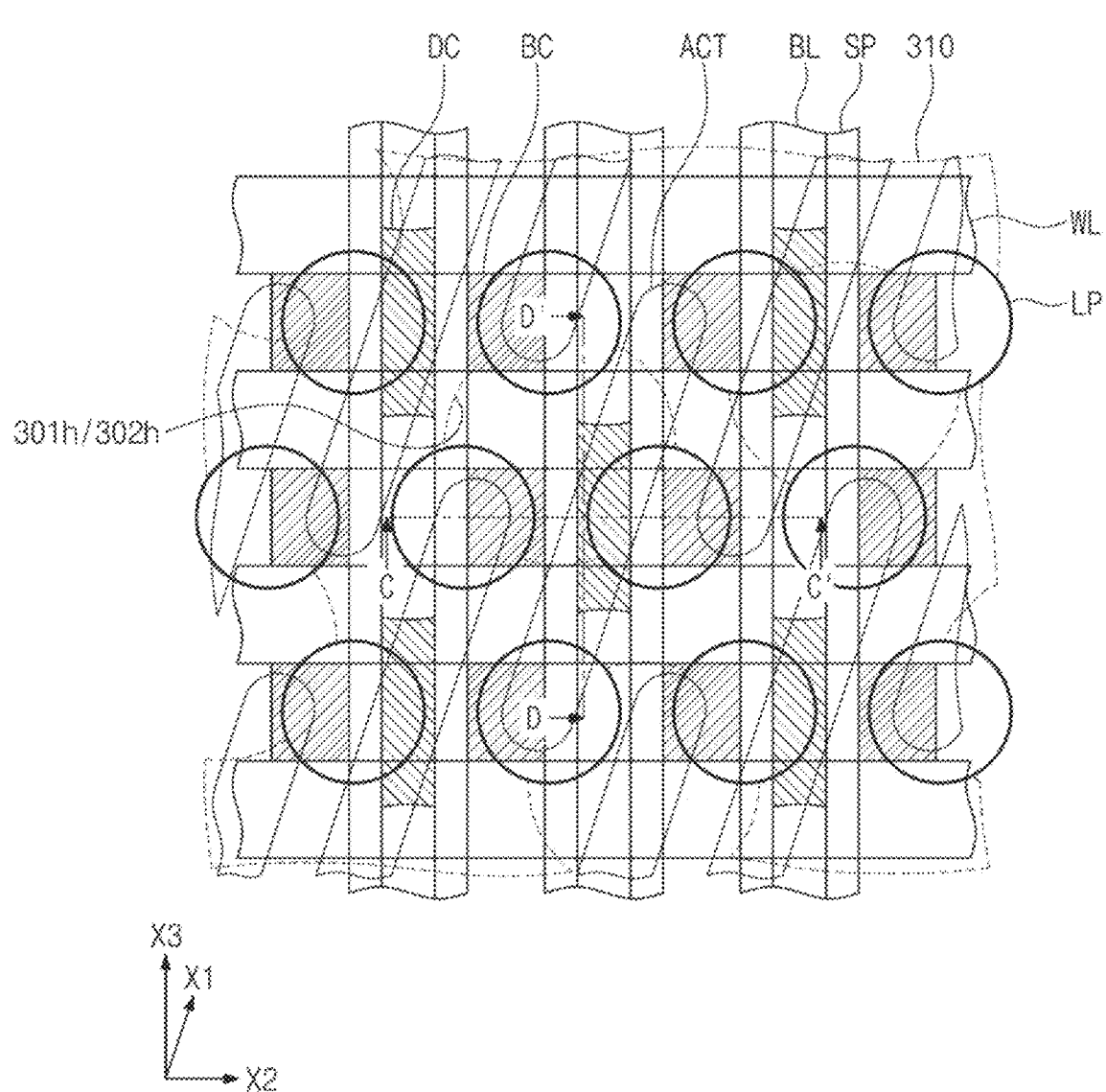
FIG. 16 is a plan view illustrating a semiconductor device according to an example embodiment of the inventive concept.
Figure 17:
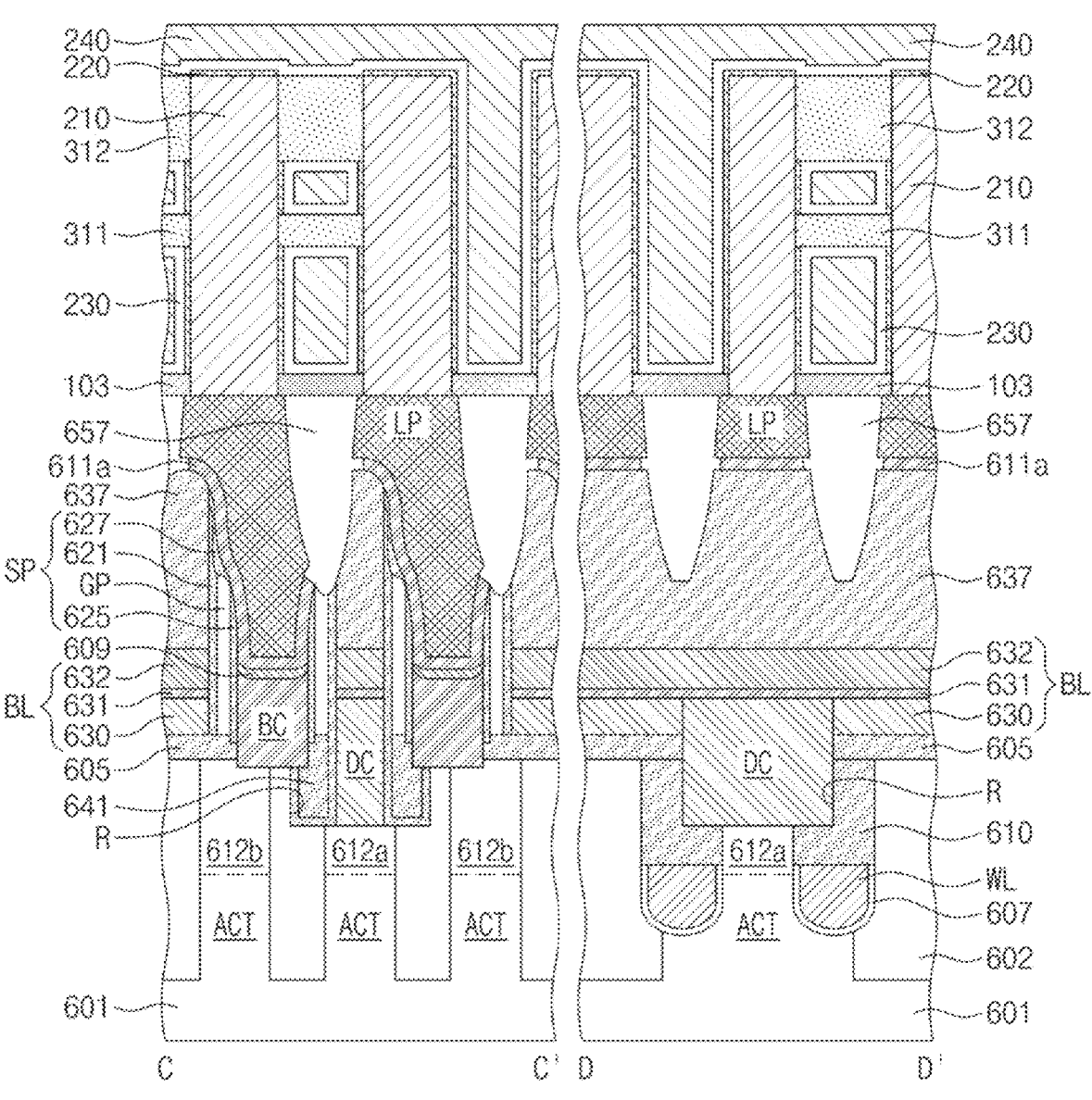
FIG. 17 is a sectional view illustrating cross-sections of a semiconductor device, which are taken along lines C-C' and D-D' of FIG. 16, according to an example embodiment of the inventive concept.

FIG. 16 is a sectional view illustrating a semiconductor device according to an example embodiment of the inventive concept. FIG. 17 is a sectional view illustrating cross-sections of a semiconductor device according to an example embodiment of the inventive concept, taken along lines C-C' and D-D' of FIG. 16.

Referring to FIGS. 16 and 17, device isolation patterns 602 may be disposed in a substrate 601 to define active portions ACT. Each of the active portions ACT may have an isolated shape. Each of the active portions ACT may be a bar-shaped pattern extending in a first direction X1, when viewed in a plan view. When viewed in a plan view, the active portions ACT may correspond to portions of the substrate 601, each of which is enclosed by the device isolation pattern 602. The substrate 601 may be formed of or may include a semiconductor material. The active portions ACT may be arranged to be parallel to each other and the first direction X1, and each of the active portions ACT may be disposed to have an end portion that is adjacent to a center of another active portion ACT.

Word lines WL may be disposed to cross the active portions ACT. The word lines WL may be disposed in grooves, which are formed in the device isolation patterns 602 and the active portions ACT. The word lines WL may be parallel to a second direction X2, which is non-parallel to the first direction X1. The word lines WL may be formed of or may include a conductive material. A gate dielectric layer 607 may be disposed between each of the word lines WL and an inner surface of each of the grooves. Although not shown, the groove may be formed to have a relatively large depth in the device isolation patterns 602 and a relatively small depth in the active portions ACT. The gate dielectric layer 607 may be formed of or may include at least one of thermally-grown oxide, silicon nitride, silicon oxynitride, and high-k dielectric materials. The word line WL may have a curved bottom surface.

A first doped region 612a may be disposed in each active portion ACT between each pair of the word lines WL, and a pair of second doped regions 612b may be respectively disposed in opposite edge regions of each active portion ACT. In an embodiment, the first and second doped regions 612a and 612b may be doped with n-type impurities. The first doped region 612a may correspond to a common drain region, and the second doped regions 612b may correspond to a source region. Each of the word lines WL and the first and second doped regions 612a and 612b adjacent thereto may constitute a transistor. Since the word lines WL are disposed in the grooves, a channel region below the word line WL may have an increased channel length within a given planar area. Thus, it may be possible to suppress the short channel effect.

Top surfaces of the word lines WL may be lower than top surfaces of the active portions ACT in a vertical direction. A word line capping pattern 610 may be disposed on each of the word lines WL. The word line capping pattern 610 may contact top surfaces of the word lines WL. The word line capping pattern 610 may be a line-shaped pattern extending in a length direction of the word lines WL and may cover the entire top surface of the word line WL. The word line capping patterns 610 may fill the grooves on the word lines WL. The word line capping pattern 610 may be formed of or may include silicon nitride.

An interlayer insulating pattern 605 may be disposed on the substrate 601. The interlayer insulating pattern 605 may be formed of or may include at least one of silicon oxide, silicon nitride, or silicon oxynitride, and may have a single- or multi-layered structure. The interlayer insulating pattern 605 may be island-shaped patterns, which are spaced apart from each other, when viewed in a plan view. The interlayer insulating pattern 605 may be formed to cover both of end portions of two active portions ACT, which are adjacent to each other.

A recess region R may be formed by partially recessing upper portions of the substrate 601, the device isolation pattern 602, and the word line capping pattern 610. The recess region R may be formed to have a mesh shape, when viewed in a plan view. A side surface of the recess region R may be aligned to a side surface of the interlayer insulating pattern 605.

Bit lines BL may be disposed on the interlayer insulating pattern 605. The bit lines BL may be provided to cross the word line capping patterns 610 and the word lines WL. As shown in FIG. 14, the bit lines BL may be parallel to a third direction X3 that is non-parallel to the first and second directions X1 and X2. The bit lines BL may include a bit line poly silicon pattern 630, a bit line ohmic pattern 631, and a bit line metal-containing pattern 632, which are sequentially stacked. The bit line poly silicon pattern 630 may be formed of or include doped or undoped poly silicon. The bit line ohmic pattern 631 may be formed of or include at least one of metal silicide materials. The bit line metal-containing pattern 632 may be formed of or may include at least one of metallic materials (e.g., tungsten, titanium, and tantalum) or conductive metal nitride materials (e.g., titanium nitride, tantalum nitride, and tungsten nitride). A bit line capping pattern 637 may be disposed on each of the bit lines BL. The bit line capping patterns 637 may be formed of an insulating material (e.g., silicon nitride).

Bit line contacts DC may be disposed in the recess region R crossing the bit lines BL. The bit line contacts DC may be formed of or may include doped or undoped poly silicon. When viewed in the section taken along the line D-D' of FIG. 17, a side surface of the bit line contact DC may be in contact with the side surface of the interlayer insulating pattern 605. When viewed in the plan view of FIG. 16, the side surface of the bit line contact DC in contact with the interlayer insulating pattern 605 may be concave. The bit line contact DC may be provided to electrically connect the first doped region 612a to the bit line BL.

A lower gapfill insulating pattern 641 may be disposed in a portion of the recess region R, which is not filled with the bit line contact DC. The lower gapfill insulating pattern 641 may be a single- or multi-layered structure that is formed of or includes at least one of silicon oxide, silicon nitride, or silicon oxynitride.

Storage node contacts BC may be disposed between an adjacent pair of the bit lines BL. The storage node contacts BC may be spaced apart from each other. The storage node contacts BC may be formed of or may include doped or undoped poly silicon. The storage node contact BC may have a concave top surface. An insulating pattern (not shown) may be disposed between the bit lines BL and between the storage node contacts BC.

A bit line spacer SP may be interposed between the bit line BL and the storage node contact BC. The bit line spacer SP may include a first sub-spacer 621 and a second sub-spacer 625, which are spaced apart from each other by a gap region GP. The gap region GP may be referred to as an air gap region. The first sub-spacer 621 may cover a side surface of the bit line BL and a side surface of the bit line capping pattern 637. The second sub-spacer 625 may be adjacent to the storage node contact BC. The first and second sub-spacers 621 and 625 may be formed of or include the same material. For example, the first and second sub-spacers 621 and 625 may be formed of or may include silicon nitride.

A bottom surface of the second sub-spacer 625 may be lower than a bottom surface of the first sub-spacer 621 in the vertical direction. A height of an upper end of the second sub-spacer 625 may be lower than a height of an upper end of the first sub-spacer 621 in the vertical direction. In this case, it may be possible to increase a process margin in a subsequent process of forming a landing pad LP. Accordingly, it may be possible to prevent the landing pad LP from being disconnected from the storage node contact BC. The first sub-spacer 621 may be extended to cover the side surface of the bit line contact DC and the side and bottom surfaces of the recess region R. For example, the first sub-spacer 621 may be interposed between the bit line contact DC and the lower gapfill insulating pattern 641, between the word line capping pattern 610 and the lower gapfill insulating pattern 641, between the substrate 601 and the lower gapfill insulating pattern 641, and between the device isolation pattern 602 and the lower gapfill insulating pattern 641.

A storage node ohmic layer 609 may be disposed on the storage node contact BC. The storage node ohmic layer 609 may be formed of or may include at least one of metal silicide materials. A diffusion prevention pattern 611a may be provided to cover the storage node ohmic layer 609, the first and second sub-spacers 621 and 625, and the bit line capping pattern 637 with a uniform thickness. The diffusion prevention pattern 611a may be formed of or may include at least one of metal nitride materials (e.g., titanium nitride and tantalum nitride). The landing pad LP may be disposed on the diffusion prevention pattern 611a. The landing pads LP may correspond to the lower electrode contacts 102 of FIG. 2. The landing pad LP may be formed of or may include a metal-containing material (e.g., tungsten). An upper portion of the landing pad LP may cover a top surface of the bit line capping pattern 637 and may have a width larger than the storage node contact BC. A center of the landing pad LP may be shifted from a center of the storage node contact BC in the second direction X2. A portion of the bit line BL may be overlapped with the landing pad LP when viewed in a plan view. An upper sidewall of the bit line capping pattern 637 may be overlapped with the landing pad LP and may be covered with a third sub-spacer 627. A pad isolation pattern 657 may be interposed between the landing pads LP. The pad isolation pattern 657 may correspond to the interlayer insulating layer 101 of FIG. 2. The pad isolation pattern 657 may be formed of or may include at least one of silicon nitride, silicon oxide, silicon oxynitride, or porous insulating materials. The pad isolation pattern 657 may define a top end of the gap region GP.

The lower electrodes 210 may be disposed on the landing pads LP, respectively. The lower electrodes 210 may correspond to the lower electrodes 210 described with reference to FIG. 2. For example, side surfaces of the lower electrodes 210 may be connected to each other by the first and second supporting patterns 311 and 312. The first and second supporting patterns 311 and 312 may be provided to have a plurality of supporting holes 301h and 302h.

The pad isolation pattern 657 between the lower electrodes 210 may have a top surface that is covered with the etch stop layer 103. In an embodiment, the etch stop layer 103 may be formed of or may include at least one of insulating materials (e.g., silicon nitride, silicon oxide, and silicon oxynitride). Surfaces of the lower electrode 210, which are not in contact with the first and second supporting patterns 311 and 312, may be covered with the conductive pattern 220. The conductive islands 222 (e.g., see FIG. 3) may be disposed on surfaces of the first and second supporting patterns 311 and 312, which are not in contact with the lower electrodes 210. The dielectric layer 230 may be provided to cover the conductive pattern 220, the conductive island 222 (e.g., see FIG. 3), and the supporting patterns 311 and 312. The dielectric layer 230 may be covered with the upper electrode 240. In addition, the semiconductor device according to an embodiment of the inventive concept may include a capacitor, which is provided to have substantially the same structure as that of FIG. 2.

In a method of fabricating a semiconductor device according to an embodiment of the inventive concept, a conductive pattern may be locally formed on only an exposed surface of a lower electrode through a selective deposition process. Thus, it may be possible to omit an additional process for removing the conductive pattern from an unwanted region and thereby to simplify the fabrication process and to increase a production yield.

While example embodiments of the inventive concept have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    forming an insulating layer on a substrate;
    forming lower electrode contacts on the substrate to penetrate the insulating layer;
    alternatingly stacking sacrificial layers and supporting layers on the insulating layer to form a stack;

forming lower electrodes to penetrate the stack and to be in contact with the lower electrode contacts;

patterning the supporting layers to form supporting patterns;

removing the sacrificial layers to expose the lower electrodes;

performing a deposition process, in which a metal material is used, on the lower electrodes and the supporting patterns to form a conductive pattern on the lower electrodes;

forming a dielectric layer to cover the supporting patterns and the conductive pattern; and forming an upper electrode to cover the dielectric layer, wherein the conductive pattern is formed to cover top surfaces and side surfaces of the lower electrodes, which are exposed by the supporting patterns, and to expose the supporting patterns, and wherein in the deposition process, a first deposition rate of the metal material deposited on the lower electrodes is faster than a second deposition rate of the metal material deposited on the supporting patterns.

2. The method of claim 1, wherein the supporting patterns contain carbon (C), and wherein a concentration of carbon (C) in the supporting patterns is higher than a concentration of carbon (C) in the lower electrodes.

3. The method of claim 1, wherein the deposition process is performed at a temperature of 250° C. to 700° C.

4. The method of claim 1, wherein, during the deposition process, the metal material is deposited on the supporting patterns to form conductive islands, which are scattered on the surfaces of the supporting patterns and are spaced apart from each other.

5. The method of claim 1, wherein the metal material comprises niobium (Nb), tantalum (Ta), tin (Sn), molybdenum (Mo), titanium (Ti), indium (In), nickel (Ni), cobalt (Co), tungsten (W), or ruthenium (Ru).

6. The method of claim 1, wherein the dielectric layer is spaced apart from the lower electrodes with the conductive pattern interposed therebetween.

7. A method of fabricating a semiconductor device, comprising:

stacking a sacrificial layer and a supporting layer on a substrate;

forming lower electrodes to penetrate the supporting layer and the sacrificial layer and to be in contact with the substrate;

patterning the supporting layer to form a supporting pattern;

removing the sacrificial layer to expose side surfaces of the lower electrodes, which are not in contact with the supporting pattern; and performing a deposition process, in which a metal material is used, on the lower electrodes and the supporting pattern to form a conductive pattern on top surfaces of the lower electrodes and on the side surfaces of the lower electrodes, which are not in contact with the supporting pattern, wherein the conductive pattern is formed to expose a surface of the supporting pattern, wherein the deposition process comprises repeating a cycle, and wherein a number of the cycles, which are repeated to deposit a single atomic layer of the metal material on the lower electrode, is less than a number of the cycles, which are repeated to deposit a single atomic layer of the metal material on the supporting pattern.

8. The method of claim 7, wherein the cycle comprises:

supplying a gas containing a precursor material to adsorb the precursor material on the lower electrodes and the supporting pattern;

purging the gas containing a portion of the precursor material, which is not adsorbed on the lower electrodes and the supporting pattern;

supplying a reaction gas, which is used for reaction with the precursor material; and purging a portion of the reaction gas, which does not react with the precursor material.

9. The method of claim 7, wherein the deposition process comprises:

forming islands on the surface of the lower electrodes or the surface of the supporting pattern; and enlarging the islands to form a single atomic layer of the metal material.

10. The method of claim 9, wherein the deposition process is performed to form a layer, which contains the metal material and has at least a thickness of a single atomic layer, on the lower electrode, and to form the islands, which contain the metal material, on the supporting pattern.

11. The method of claim 7, wherein the supporting pattern contains carbon (C).

12. The method of claim 7, wherein the deposition process is performed at a temperature of 250° C. to 700° C.

13. The method of claim 7, wherein the conductive pattern is selectively deposited on the top and side surfaces of the lower electrodes, which are not in contact with the supporting pattern.

14. The method of claim 7, further comprising:

forming a dielectric layer on the supporting pattern and the conductive pattern; and forming an upper electrode on the dielectric layer.

* * * * *